(12) United States Patent
Hirata

(10) Patent No.: US 6,321,364 B1
(45) Date of Patent: Nov. 20, 2001

(54) METHOD FOR DESIGNING INTEGRATED CIRCUIT DEVICE BASED ON MAXIMUM LOAD CAPACITY

(75) Inventor: Morihisa Hirata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/049,930

(22) Filed: Mar. 30, 1998

(30) Foreign Application Priority Data

Mar. 28, 1997 (JP) .................................................... 9-077424

(51) Int. Cl.⁷ ....................................................... G06F 17/50
(52) U.S. Cl. .......................................... 716/5; 716/1; 716/4
(58) Field of Search ........................ 395/500.06, 500.09, 395/500.11, 500.35, 500.36, 500.37; 716/5, 6, 10, 1, 4

(56) References Cited

U.S. PATENT DOCUMENTS

| | | | |
|---|---|---|---|
| 5,410,490 | * | 4/1995 | Yastrow .................................... 716/5 |
| 5,459,673 | * | 10/1995 | Carmean et al. .......................... 716/6 |
| 5,467,291 | * | 11/1995 | Fan et al. ................................. 703/14 |
| 5,612,907 | * | 3/1997 | Lange et al. ............................. 703/14 |
| 5,671,148 | * | 9/1997 | Urano et al. ............................. 702/65 |
| 5,790,436 | * | 8/1998 | Chen et al. ............................... 716/5 |
| 5,983,008 | * | 11/1999 | Kumashiro et al. ....................... 716/6 |
| 6,024,478 | * | 2/2000 | Yamamoto ................................ 716/5 |

FOREIGN PATENT DOCUMENTS

| | | |
|---|---|---|
| 3-142964 | 6/1991 | (JP) . |
| 6-151735 | 5/1994 | (JP) . |
| 6-196672 | 7/1994 | (JP) . |
| 9-27741 | 1/1997 | (JP) . |

OTHER PUBLICATIONS

Usuf, "Design Considerations for CMOS Degital Circuits with Improved Hot–Carrier Reliability," IEEE, pp. 1014–1024, Jul. 1996.*

Hwang et al, "Enhanced Degradation of n MOSET's Under Hot Carrier Stress at Elevated Temperatures Due to the Length of Velocity Saturation Regions." IEEE, pp. 39–72, Jul. 1994.*

Quader et al, "Hot–Carrier–Reliability Design Rules for Translating Device Degradation to CMOS Digital Circuit Degradationk," IEEE, pp. 681–691, May 1994.*

Roy et al, "Logic Synthesis for Reliability: An Early Start to Controlling Electromigration & Hot–Carrier Effects," IEEE, pp. 251–255, Jun. 1995.*

Ping–Chung Ii, and Hajj, I.N., "Computer–Aided Redesign of VLSI Circuits for Hot–Carrier Reliability", IEEE Transactions on Computer–Aided Design of Integrated Circuits and Systems, vol. 15, No. 5, May 1996, pp. 453–464.*

* cited by examiner

Primary Examiner—Matthew Smith
Assistant Examiner—Vuthe Siek
(74) Attorney, Agent, or Firm—Foley & Lardner

(57) ABSTRACT

In a method for designing an integrated circuit device, maximum load capacities of a number of circuit elements are calculated by a simulation method. The maximum load capacities are stored in a database, or approximation formulae are calculated therefrom. A maximum load capacity for a circuit element is retrieved from the database or is approximately calculated by using a corresponding one of the approximation formulae in accordance with input conditional data. Then, the integrated circuit device is designed so as to make a load capacity of each of circuit elements smaller than the retrieved or approximately calculated maximum load capacity.

12 Claims, 9 Drawing Sheets

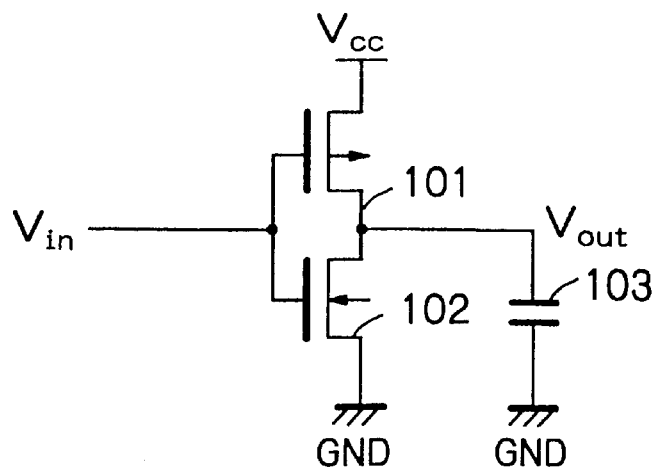
Fig. 1
PRIOR ART
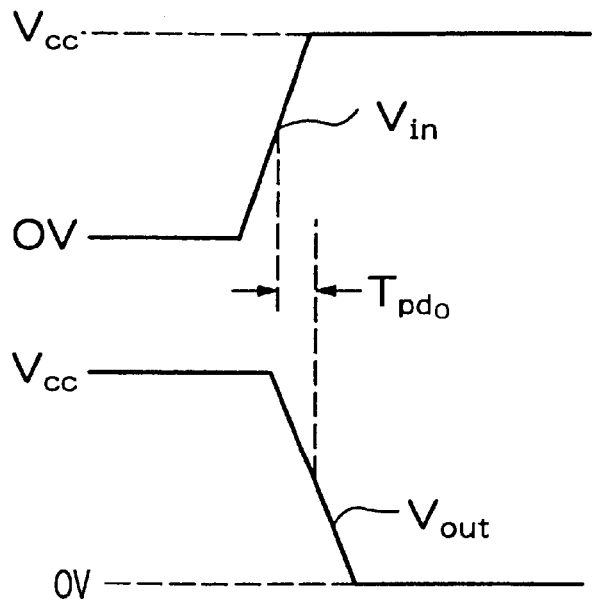
Fig. 2A
PRIOR ART
Fig. 2B
PRIOR ART
Fig. 3
PRIOR ART

METHOD FOR DESIGNING INTEGRATED CIRCUIT DEVICE BASED ON MAXIMUM LOAD CAPACITY

BACKGROUND OF THE INVENTION

1. Field of the Invention

The present invention relates to a method for designing an integrated circuit device.

2. Description of the Related Art

In recent years, technologies for integrating various circuit elements such as transistors and inverters into large scale integrated circuit (LSI) devices have been developed and such integrated circuit devices have been widely commercialized. However, in the integrated circuit devices, the performance degradation due to hot carriers will not be negligible.

For example, inverts normally play a major role in an integrated circuit device. In an inverter, during a transition time period from the timing when an input signal rises to the timing when an output signal falls, hot carriers are generated to degrade the performance and deteriorate the output characteristics. If such degradation with time in the performance of circuit elements due to hot carriers goes beyond an allowable limit during the guaranteed period of the integrated circuit device, the integrated circuit device will be tagged as defective. This will be explained later in detail.

In a first prior art method, in order to avoid such a situation, integrated circuit devices are so designed as to make them perform without degrading beyond the allowable limit, at least during the guaranteed period of the device. More specifically, in the course of designing an integrated circuit device by arranging various circuit elements, the degradation with time of each of the circuit elements is simulated using a simulation method such as "SPICE" and various design data. Thus, the performance of each of the circuit elements of the integrated circuit device at the end of the guaranteed period can be anticipated by the simulation method. If the anticipated performance is not found within an allowable range, the design and layout of the integrated circuit device will have to be changed.

On the other hand, while hot carriers are generated in a circuit element such as an inverter during its signal transition period, it will be subject to degradation due to hot carriers and other factors less if the transition period is shorter. Since the signal transition time of the circuit element depends on its load capacity, a circuit element having a small load capacity shows little degradation of performance attributable to hot carriers. The load capacity is the capacity of an output line of the circuit element, and hence depends on the length of the output line and the downstream circuit elements connected to it.

In a second prior art method (see: JP-A-3-142964), after an integrated circuit device is designed, the load capacity of each of the circuit elements of the integrated circuit device is calculated and is then divided by the rising time and the transfer factor of the circuit elements. The calculated value is then compared with a reference value and, if the former exceeds the latter, the design of the circuit element will be modified.

In the above-described prior art methods, it is possible to design an integrated circuit device such that its performance will not degrade beyond an allowable limit during the guaranteed period of the device by taking the degradation with time of each of the circuit elements due to hot carriers into consideration.

In the first prior art method, the use of a simulation method such as "SPICE" for an integrated circuit device normally comes into the scene after the completion of the entire design of the integrated circuit device to validate the reliability of the circuit elements. In other words, if any of the circuit elements is found defective as a result of the simulation, the finished integrated circuit device has to be modified. Similarly, the second prior art method also checks the reliability of each of the circuit elements of an integrated circuit device after the completion of the entire design of the device and then corrects or modifies the design and layout of the device if necessary.

However, it is not easy to modify the finished integrated circuit device because, if one of the circuit elements is modified, the performance of the remaining circuit elements can be affected by the modification and, therefore, the performance of the modified integrated circuit device will have to be simulated once again. Particularly, for an integrated circuit device that is normally constructed by a large number of circuit elements as integral parts thereof, if such simulations and modifications are repeated for a number of times on each of the circuit elements, the time consumed for the design of the integrated circuit device will be enormous when the design is completed.

SUMMARY OF THE INVENTION

It is an object of the present invention to provide a method for designing an integrated circuit device capable of swiftly designing the integrated circuit device including circuit elements, each of which is not degraded with time beyond a predetermined allowable limit by hot carriers within a guaranteed period.

According to the present invention, in a method for designing an integrated circuit device, the maximum load capacity of each of a number of circuit elements to be used in the integrated circuit device is calculated by simulation. Then, the integrated circuit device is designed so as to make the load capacity of a circuit element smaller than the corresponding maximum load capacity. In this case, the maximum load capacities are stored in a data bass, or approximation formulae are calculated from the maximum load capacities.

BRIEF DESCRIPTION OF THE DRAWINGS

The present invention will be more clearly understood from the description as set forth below, with reference to the accompanying drawings, wherein:

FIG. 1 is a circuit diagram illustrating a CMOS inverter for explaining the hot carrier effect;

FIGS. 2A and 2B are timing diagrams of the input signal and the output signal of FIG. 1;

FIG. 3 in a graph showing the relationship between the life time and the device degradation of FIG. 1;

DESCRIPTION OF THE PREFERRED EMBODIMENTS

Before the description of the preferred embodiments, the hot carrier effect will be explained with reference to FIGS. 1, 2 and 3.

In FIG. 1, which illustrates a CMOS inverter, a P-channel MOS transistor 101 and an N-channel MOS transistor 102 are connected between a power supply voltage terminal $V_{cc}$ and a ground terminal GND. An input voltage $V_{in}$ is applied to the gates of the transistors 101 and 102, and an output voltage $V_{out}$ from the inverter is applied to a load capacitor 103.

When the input voltage $V_{in}$ rises as shown in FIG. 2A, the output voltage $V_{out}$ falls as shown in FIG. 2B. In this case, a high electric field is generated in the vicinity of a drain region of the N-channel transistor 102, so that hot carriers are generated therein, thus degrading the performance of the inverter, particularly, the transistor 102. This is called the hot carrier effect. In order to alleviate the hot carrier effect, a lightly-doped drain (LDD) configuration is adopted for the transistor 102, or a good insulating layer is adopted for the gate insulating layer of the transistor 102 to suppress the accumulation of hot carriers in the gate insulating layer.

When the performance of the inverter of FIG. 1 is degraded due to the hot carrier effect, the response delay time from the rising edge of the input voltage $V_{in}$ to the falling edge of the output voltage $V_{out}$ of FIGS. 2A and 2B is increased from $T_{pd0}$ to $T_{pd0}+\Delta T_{pd}$, where $\Delta T_{pd}$ is a response delay time deviation.

The degree of device degradation can be represented by $\Delta T_{pd}/T_{pd0}$. As shown in FIG. 3, the longer the device operating time OT, the larger the degree $\Delta T_{pd}/T_{pd0}$ of device degradation. If an allowable limit of the degree $\Delta T_{pd}/T_{pd0}$ is 5 percent, the guaranteed period of the device is denoted by X as shown in FIG. 3.

On the other hand, the degree $\Delta T_{pd}/T_{pd0}$ depends upon the capacity of the load capacitor 103 of FIG. 1. That is, the larger the capacity of the load capacitor 103, the larger the degree $\Delta T_{pd}/T_{pd0}$. In other words, if the conditional data of the inverter is given, the maximum capacity of the load capacitor 103 can be determined under a certain guaranteed period of the device.

Figure 4:
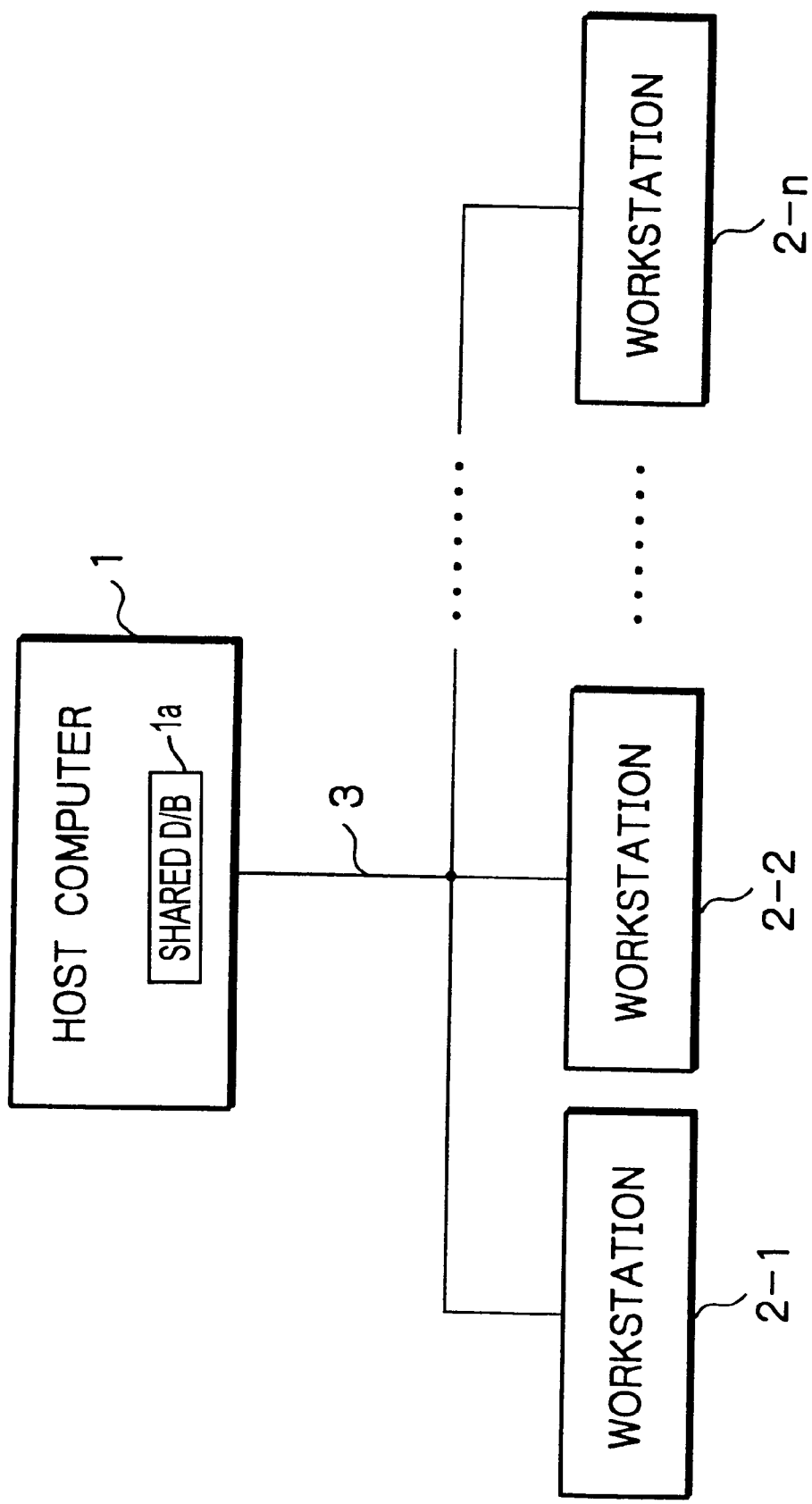
FIG. 4 is a block circuit diagram illustrating a circuit designing system for carrying out a first embodiment of the method for designing an integrated circuit device according to the present invention.

In FIG. 4, which illustrates a circuit designing system for carrying out a first embodiment of the method for designing an integrated circuit device according to the present invention, this circuit designing system is a client-server system including a host computer 1 and a plurality of workstations 2-1, 2-2, . . . , 2-n connected to each other by way of a communication network 3.

The host computer 1 is formed by a central processing unit (CPU) to a read-only memory (ROM), a random access memory (RAM), a hard disk drive (HDD) unit for mounting a hard disk, a floppy-disk drive (FDD) for mounting a floppy disk (FD), a compact disc (CD) drive unit for mounting a CD-ROM, a keyboard, a mouse, a display unit, a large capacity memory device, a communication interface (I/F) and other components by way of a bus line. The large capacity memory device typically includes a magnetic optical (MO) drive for mounting a number of MO discs arranged in parallel and is adapted to reproducibly store a large volume of data.

The communication I/F of the host computer 1 is connected to the communication network 3, which is also connected to the workstations 2-1, 2-2, . . . , 2-n.

Since each of the workstations 2-1, 2-2, . . . , 2-n has a physical structure identical with that of the host computer 1 except that it is devoid of the large capacity memory device.

In the host computer 1, the ROM, the RAM, the HDD, the FDD, the CD-ROM, the large capacity memory device and the other components are data storage media that store programs and data necessary for operating the system as software. For example, the control programs for operating the CPU in various different ways is stored in advance in the FD and/or the CD-ROM. The software is installed in the HDD in advance and copied to the RAM when the host computer 1 starts operating so that it is read into the CPU.

Thus, with the circuit designing system 1 of FIG. 4, various functional features of the system are realized as various means as the CPU reads an appropriate program and executes the program for various processing operations.

The host computer 1 and the workstations 2-1, 2-2, . . . , 2-n share a single database 1a. The database 1a is typically arranged in the large capacity memory device of the host computer 1 and stores data on the requirements to be met by various circuit elements as keys for retrieving the maximum load capacity of any of the circuit elements. Such data include the gate width, the rising time and the falling time as response time to the input signal, the maximum operating frequency, the maximum operating voltage, the guaranteed operation temperature, the switching probability, the guaranteed time and a net list of each of the circuit elements.

Figure 5:
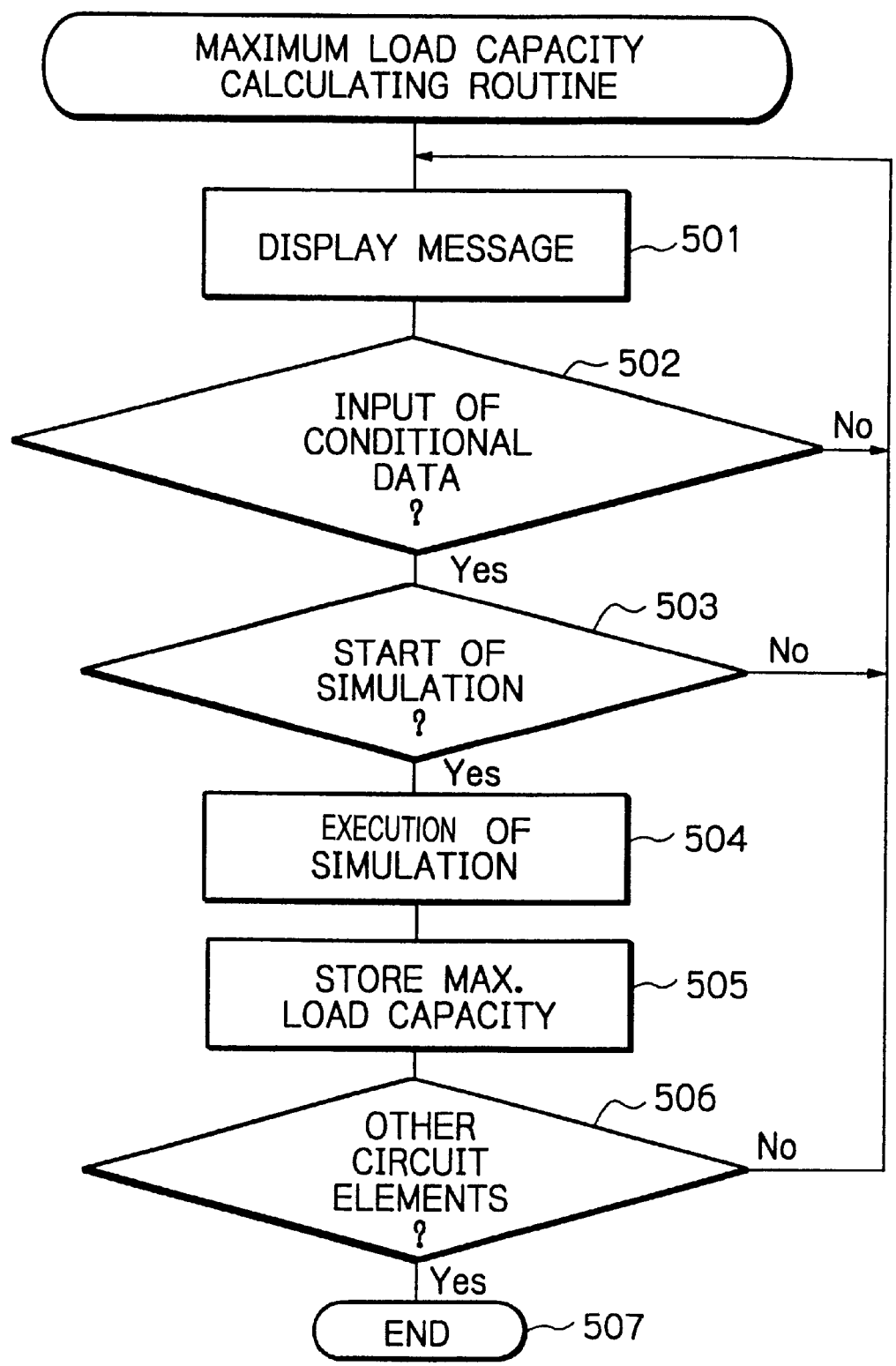
FIGS. 5, 6, and 7 are flowcharts showing the operation of the system of FIG. 4.
Figure 6:
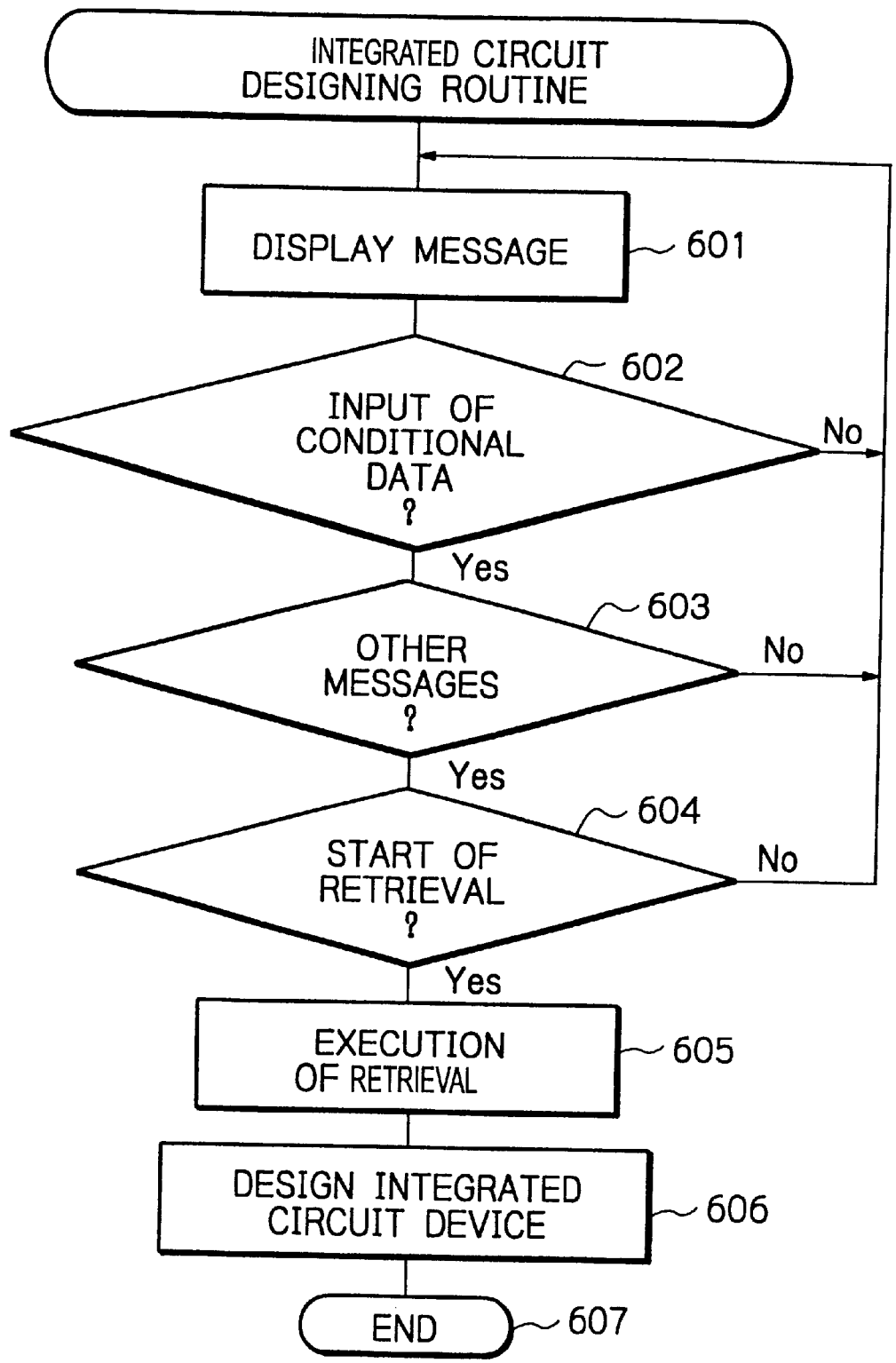
Figure 7:
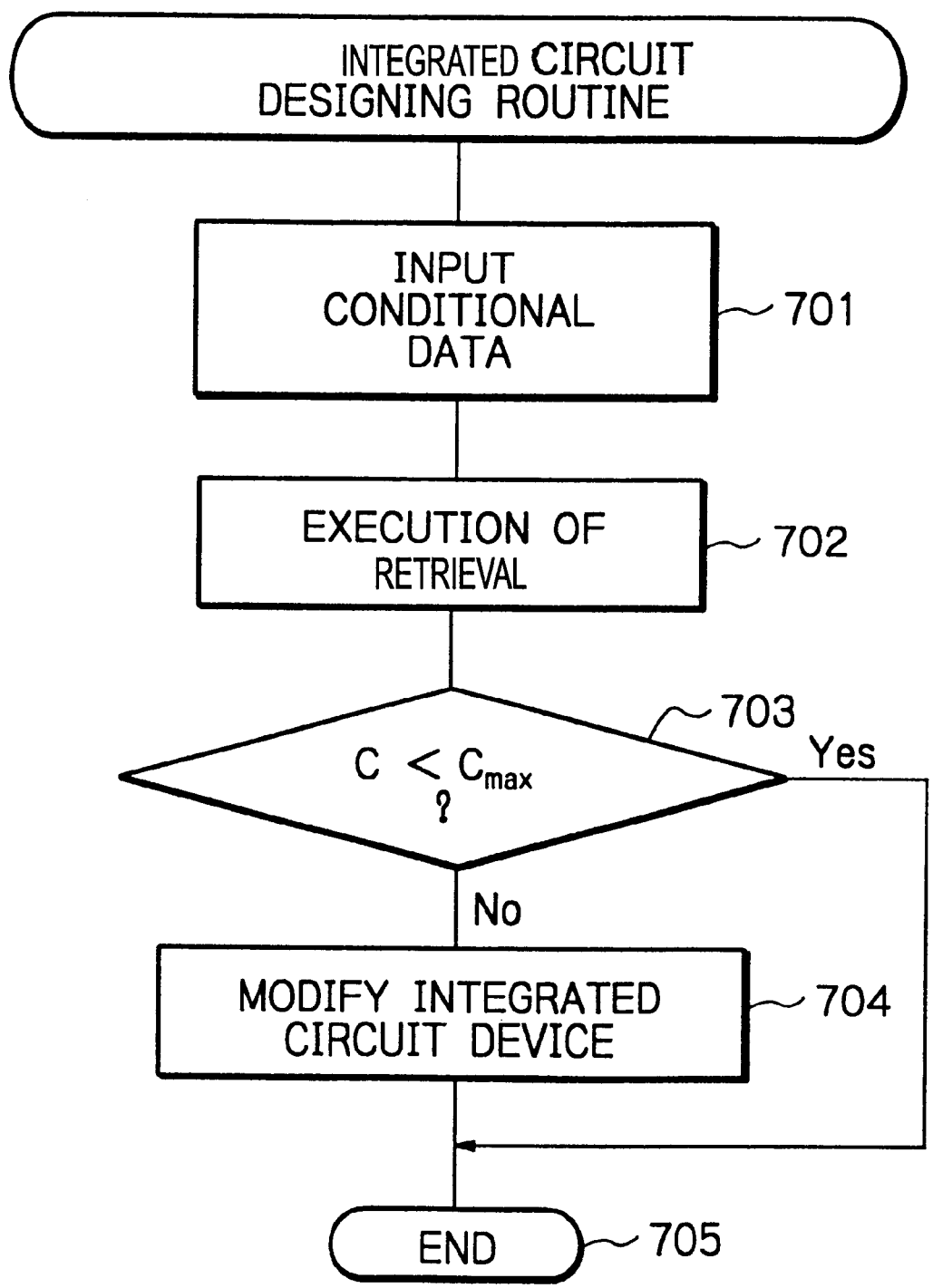

In FIG. 4, the host computer 1 carries out a maximum load capacity calculating routine as shown in FIG. 5 to prepare the database 1a in advance. Then, one of the workstations 2-1, 2-2, . . . , 2-n carries out an integrated circuit design routine as shown in FIG. 6 or 7 by utilizing the database 1a.

The maximum load capacity calculating routine of FIG. 5 carried out by the host computer 1 is explained below.

First, at step 501, a message is read from the RAM and is displayed on the display unit for guiding the user in inputting data on the requirements to be met by a circuit element.

Next, at step 502, the user inputs data by means of the keyboard in response to the displayed message, and the data is stored in the RAM. Such display of a message and reception of input data are repeated according to the number of pieces of input data, so that data on the requirements to be met by the circuit element such as the gate width of the circuit element, the rising time and the falling time of the input signal, the maximum operating frequency, the maximum operating voltage, the guaranteed operation temperatures the switching probability, the guaranteed time and a net list of the circuit element are stored in the RAM. If data is not input, the control returns to step 501.

Next, at step 503, the user starts a simulation by means of the keyboard. Otherwise, the control returns to step 501.

Next, at step 504, the maximum load capacity of the circuit element is calculated by simulation utilizing a given piece of software such as "SPICE".

Next, at step 505, the maximum load capacity of the circuit element is then stored in the database 1a with the conditional data of the RAM.

Step 506 repeats the operations at step 501 through 505 for the other circuit elements.

The routine of FIG. 5 is completed by step 507.

Thus, the maximum load capacities of different circuit elements with the data required to be met by the circuit elements are stored in the database 1a.

After the necessary data are stored in the database 1a of the host computer 1, the workstations 2-1, 2-2, . . . , 2-n now can design the desired integrated circuit device. More specifically, the user inputs necessary data through the keyboard, consulting the data displayed on the display, and designs the integrated circuit device typically by means of a known piece of design software or program. For example, the user specifies the types of circuit elements and the connections among them in the integrated circuit device and automatically executes the program to generate a layout for the circuit elements of the integrated circuit device according to the program.

The integrated circuit designing routine of FIG. 6 carried out by one of the workstations 2-1, 2-2, . . . , 2-n is explained below.

First, at step 601, a message for guiding the user in inputting necessary data for specifying the types of circuit elements is displayed on the display unit.

Next, at step 602, the user inputs data on the requirements to be met by the circuit elements in response to the displayed message. The input data is temporarily stored in the RAM. If data is not input, the control returns to step 601.

Step 603 repeats the operations at steps 601 and 602 for the other messages.

At step 604, the user inputs an instruction for starting a retrieving operation by way of the keyboard. Otherwise, the control returns to step 601.

Next, at step 605, the maximum load capacity of a specified circuit element is retrieved by using the entered data on the requirements to be met by the circuit element as retrieving keys.

Next, at step 606, an integrated circuit device is so designed an to make the load capacity of each circuit element to be held under the corresponding retrieved maximum load capacity. For example, the total length of the output line of the circuit element is caused to be less than a predetermined value.

Then, the routine of FIG. 6 is completed by step 607.

According to the first embodiment, the maximum load capacities of various circuit elements are determined in advance by calculation using various data on the requirements to be met by the circuit elements, and a necessary one is retrieved therefrom and utilized for the corresponding circuit element at the time of actually designing the integrated circuit device. Thus, no time consuming simulation is required at the time of actually designing the device and the time to be spent for designing the device can be greatly reduced. Additionally, the load capacity of each of the circuit elements of the designed integrated circuit device never exceeds the maximum load capacity for it so that the degradation with time of the device due to hot carriers is always held within a permissible range, to greatly enhance the reliability of the device.

In FIG. 6, when the user operates the workstation such as 2-1 to design a desired integrated circuit device, the user causes the system to retrieve the maximum load capacity of any of the circuit elements of the device and display it on the display unit, so that the user may design the circuit configuration of the device for himself, taking the displayed maximum load capacity into consideration. If such is the case, the circuit designing system of FIG. 4 does not operate as an automatic circuit design system for automatically designing the integrated circuit device by taking the maximum load capacity of each of its circuit elements into account but operates as a support system for supporting the user in designing an integrated circuit device.

Also, in the above described first embodiment, the maximum load capacities retrieved from the database 1a according to the entered data on the requirements to be met by the circuit elements are used for designing an integrated circuit device. However, it may alternatively be so arranged that the retrieved maximum load capacities are used for modifying and/or validating the design of the integrated circuit device. Such a use of the first embodiment is particularly advantageous in accurately retrieving the maximum load capacity of any of the circuit elements of an integrated circuit device because any data on the requirements to be met by a specific circuit element can be accurately retrieved for modifying or validating the design of the integrated circuit device. In addition, if the design data of an integrated circuit device contains those for a plurality of circuit elements for sequentially transmitting a signal, the system retrieves the data and calculates the rising time of the output signal of the upstream circuit elements as response time and provides the circuit design system of FIG. 4 with a requirement detecting means (not shown) that adopts the calculated value as the rising time of the input signal of the downstream circuit elements or the response time and specifies it as a requirement for designing the device. This is be explained with reference to FIG. 7.

First, at step 701, at least two circuit elements for sequentially transmitting a signal are detected, and the rising time of the output signal of the preceding circuit element is calculated to set it as the rising time of the input signal of the post stage circuit element. That is, this rising time is input as conditional data for the post stage circuit element.

Next, at step 702, the maximum load capacity $C_{max}$ of the post stage circuit element is retrieved from the database 1a by using the input conditional data.

Next, at step 703, the retrieved maximum load capacity $C_{max}$ is compared with the load capacity C of the circuit element being examined. As a result, if it is found that the load capacity C of the circuit element does not exceed the maximum load capacity $C_{max}$, the control directly proceeds to step 705 to complete the operation of modifying the design for the circuit element. If, on the other band, it is found that the load capacity C of the circuit element exceeds the maximum load capacity $C_{max}$, the control proceeds to step 704, which modifies the design data to make the load capacity C of the circuit element go below the maximum load capacity $C_{max}$.

Such modification of the design data on the integrated circuit device at step 704 is typically reflected on an increase in the gate width of each of the circuit elements, modification of the design data so as to reduce the total length of the output line of each of the circuit elements, modification of the arrangement of the circuit elements whose load capacities exceed respectively the corresponding maximum load capacities and modification of the circuit arrangement of the circuit elements located downstream relative to each of the circuit elements.

The rising time of the input signal of a circuit element is one of the determinants of the maximum load capacity of the circuit element and is determined by the rising time of the output signal of the circuit element located upstream relative to it and, therefore, it is difficult to accurately determine it as one of the data on the requirements to be met by the circuit element simply by analyzing the circuit element. However, with the above described first embodiment, the rising time of the input data of the downstream circuit element is detected from the design data of the integrated circuit device and the maximum load capacity of the circuit element is calculated by using it as one of the data on the requirements to be met by the circuit element, so that the maximum load capacity of the circuit element can be determined accurately and the design data can be modified and validated reliably.

In the course of actually manufacturing integrated circuit devices, it is designed by a circuit designing method according to the first embodiment and the design data will be corrected by taking margins into consideration. Then, the modified design data will be validated by the same circuit designing method and a prototype of an integrated circuit device will be manufactured by using the validated design data. Then, the manufactured prototype of the integrated circuit device is tested for any problems. If one or more problems are found, the design data will be corrected again by the same circuit designing method before integrated circuit devices of the type are manufactured on a mass production basis. If no problem is found, then integrated circuit devices will be manufactured on a mass production basis straight away.

While maximum load capacities of circuit elements are determined by simulation, using various data on the requirements to be met by the circuit elements, and stored in the database $1a$ so that any of them may be retrieved by corresponding data and utilized for designing an integrated circuit device in the first embodiment, the database $1a$ will have to store a huge volume of data in order to ideally realize such data storing and retrieving operations Therefore, if the use of a database adapted to store such a huge volume of data is not feasible, typical maximum load capacities may be determined by simulation, using appropriate data on the requirements to be met by circuit elements, and stored in the database $1a$ so that, when retrieving the maximum load capacity of a circuit element to be used in an integrated circuit device to be designed, preferably two maximum load capacities corresponding to similar data on the requirements to be met may actually be retrieved and the maximum load capacity of the circuit element may be determined approximately by interpolation, using the data on the requirements to be met by the circuit element.

Figure 8:
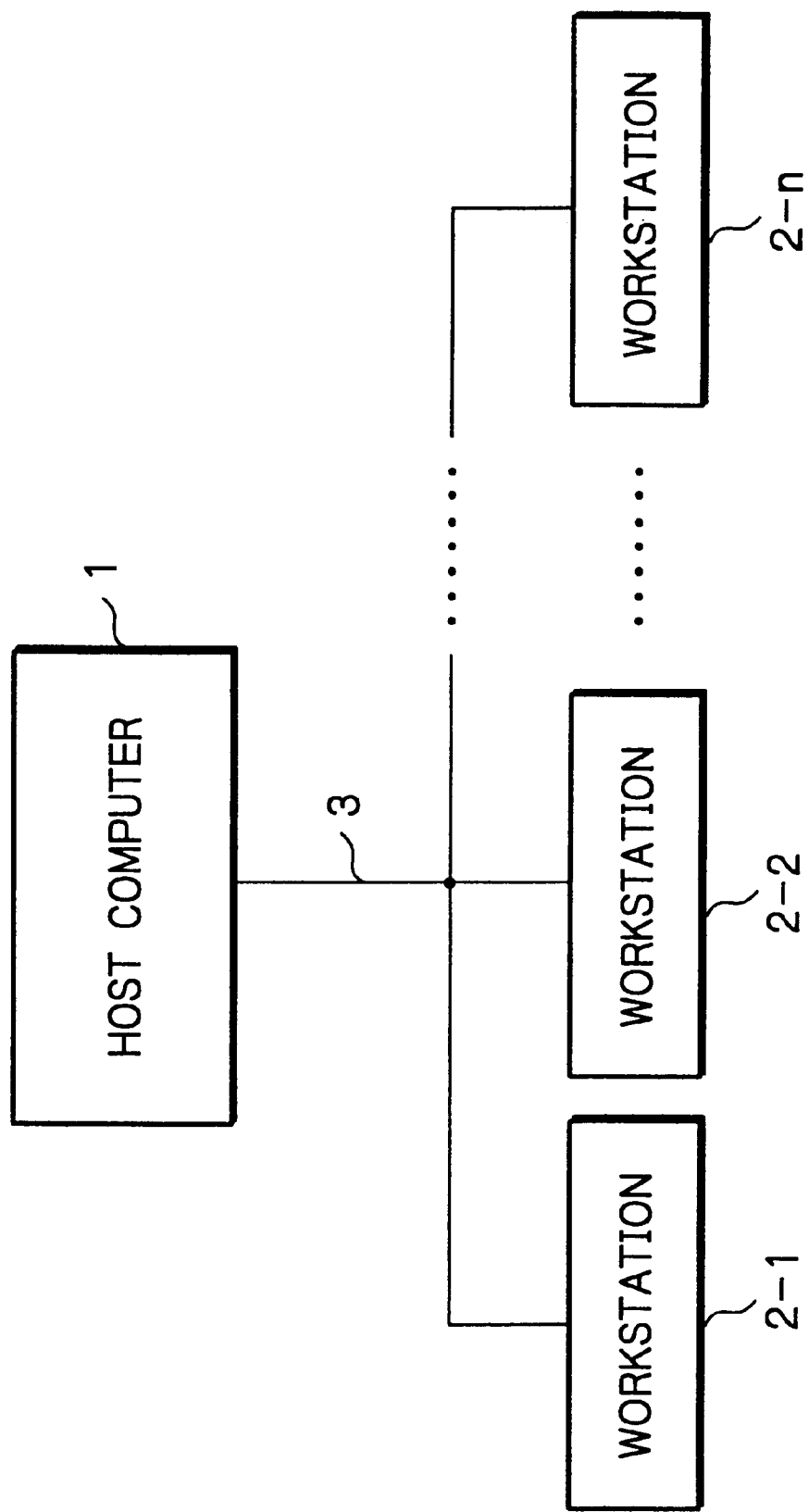
FIG. 8 is a block circuit diagram illustrating a circuit designing system for carrying out a second embodiment of the method for designing an integrated circuit device according to the present invention.

In FIG. 8, which illustrates a circuit designing system for carrying out a second embodiment of the method for designing an integrated circuit device according to the present invention, the database $1a$ of FIG. 4 is not provided. In this case, maximum load capacities are sequentially obtained by approximation formulae stored in the RAM of the host computer 1.

Figure 9:
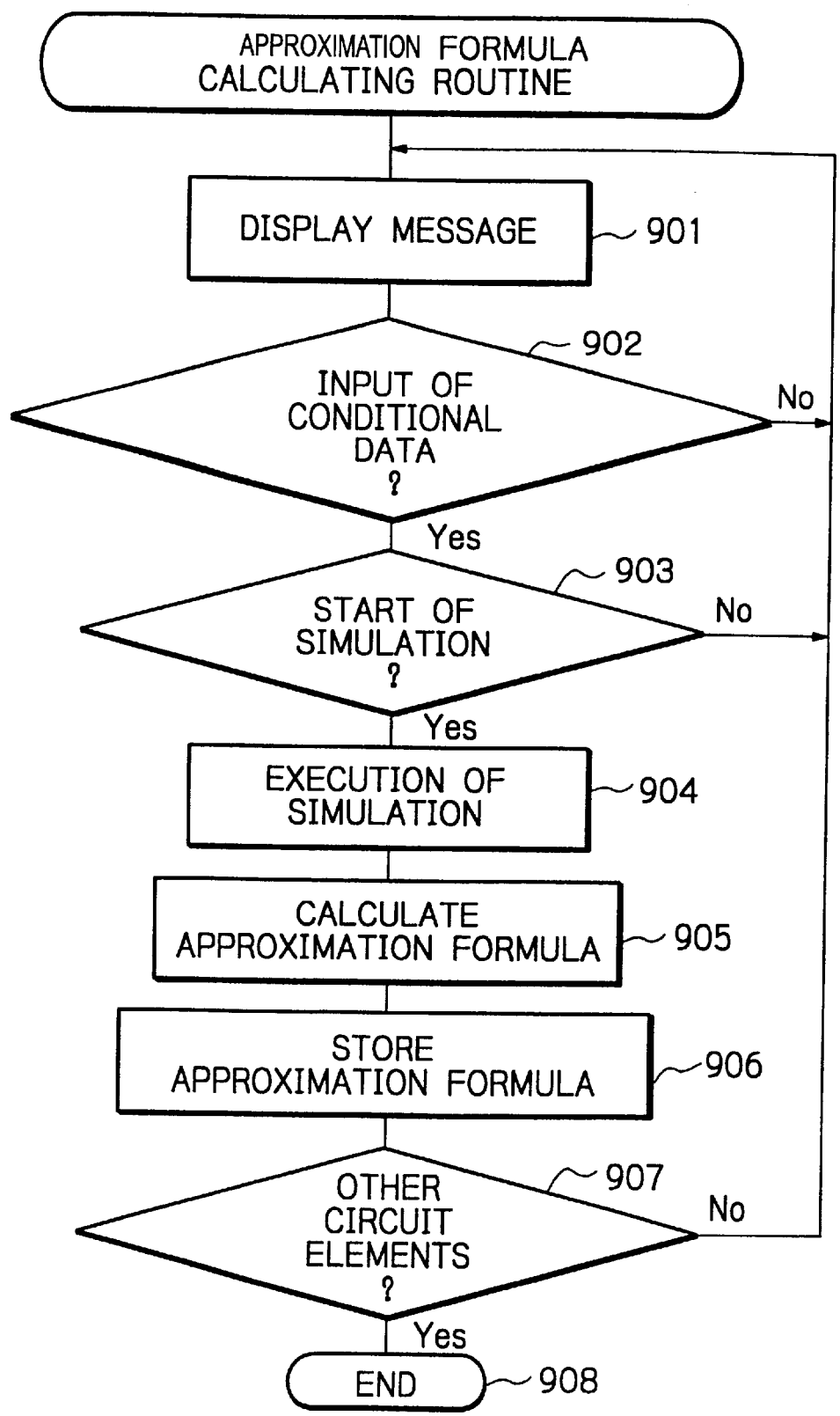
FIGS. 9, 10, and 11 are flowcharts showing the operation of the system of FIG. 8.
Figure 10:
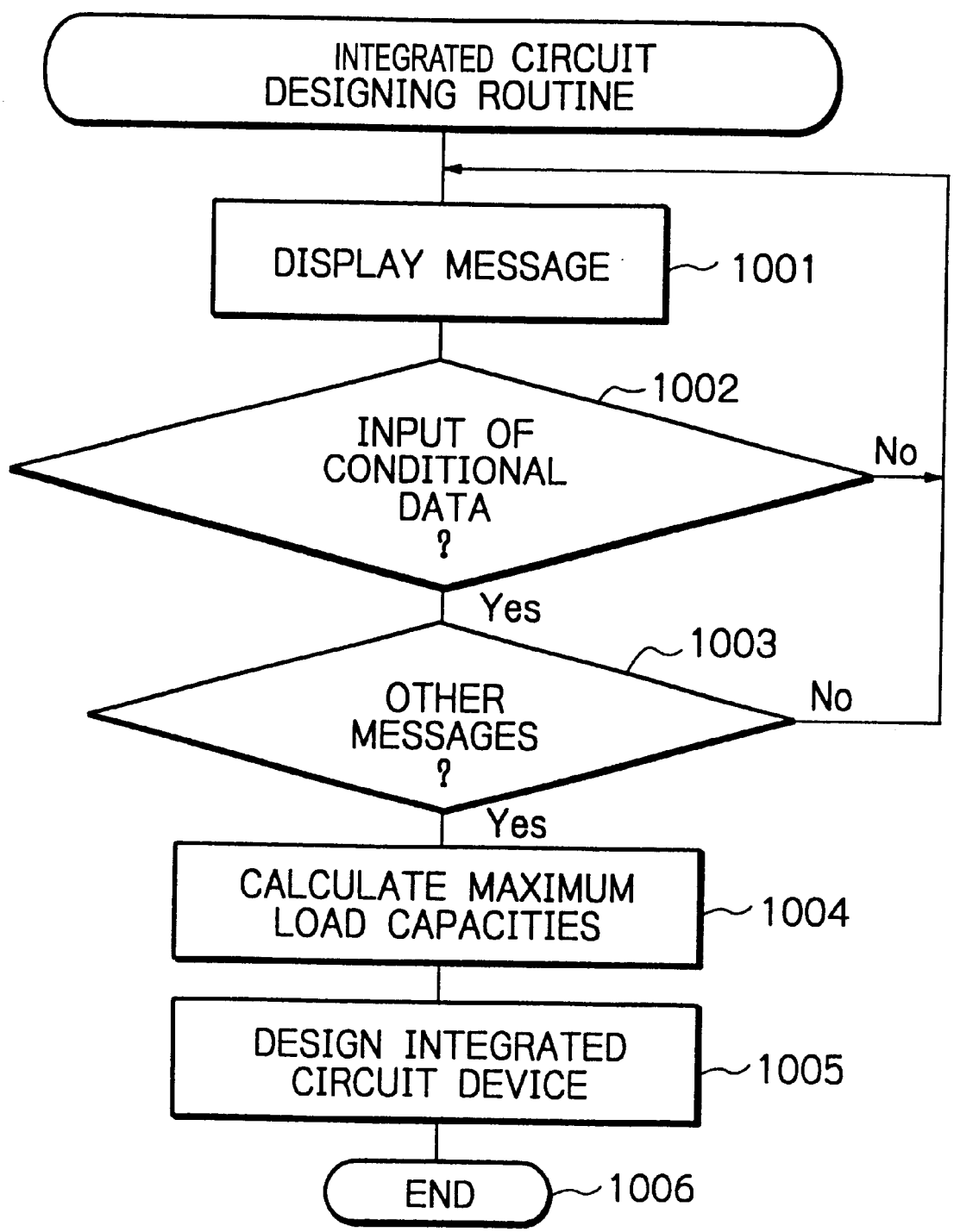
Figure 11:
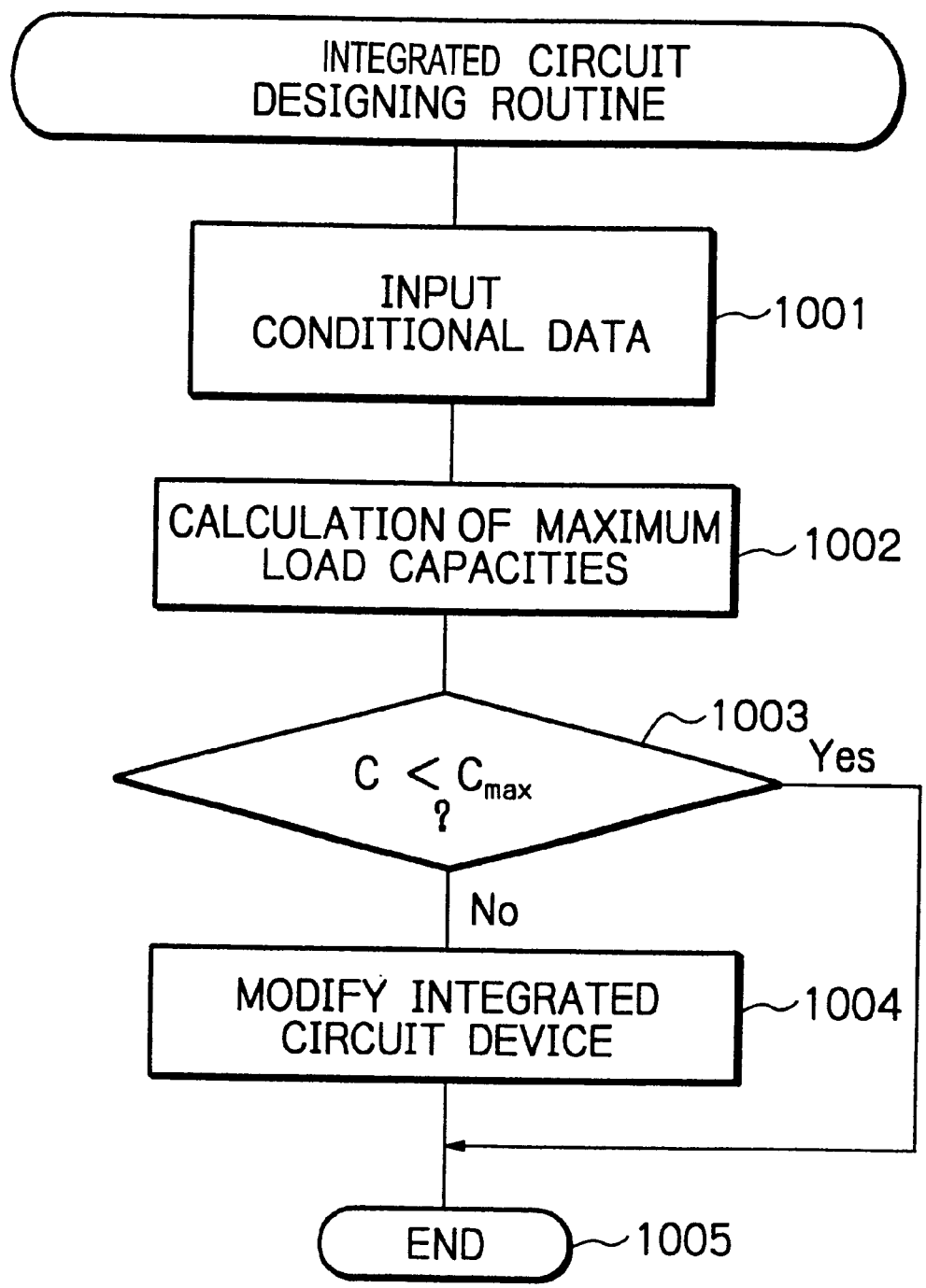

In FIG. 8, the host computer 1 carries out an approximation formula calculating routine as shown in FIG. 9 in advance. Then, one of the workstations 2-1, 2-2; . . . , 2-n carries out an integrated circuit design routine as shown in FIG. 10 or 11 by utilizing the RAM of the host computer 1

The approximation formula capacity calculating routine of FIG. 9 carried out by the host computer 1 is explained below.

First, at step 901, a message is read from the RAM and is displayed on the display unit for guiding the user in inputting data on the requirements to be met by a circuit element.

Next, at step 902, the user inputs data by means of the keyboard in response to the displayed message, and the data is stored in the RAM. Such display of a message and reception of input data are repeated according to the number of pieces of input data, so that data on the requirements to be met by the circuit element such as the gate width of the circuit element, the rising time and the falling time of the input signal, the maximum operating frequency, the maximum operating voltage, the guaranteed operation temperature, the switching probability, the guaranteed time and a net list of the circuit element are stored in the RAM. If data is not input, the control returns to step 901.

Next, at step 903, the user starts a simulation by means of the keyboard. Otherwise, the control returns to step 901.

Next, at step 904, the maximum load capacity of the circuit element is calculated by simulation utilizing a given piece of software such as "SPICE".

Next, at step 905, an approximation formula for calculating a maximum load capacity of the circuit element using conditional data is calculated.

Next, at step 906, the maximum load capacity of the circuit element is then stored in the RAM with the conditional data of the RAM.

Step 907 repeats the operations at step 901 through 906 for the other circuit elements.

The routine of FIG. 9 is completed by step 908.

Thus, the maximum load capacities of different circuit elements with the data required to be met by the circuit elements are stored in the RAM of the host computer 13.

The integrated circuit designing routine of FIG. 10 carried out by one of the workstations 2-1, 2-2, . . . , 2-n is explained below.

First at step 1001, a message to guide the user in inputting necessary data for specifying the types of circuit elements is displayed on the display unit.

Next, at step 1002, the user inputs data on the requirements to be met by the circuit elements is response to the displayed message. The input data in temporarily stored in the RAM. If data is not input, the control returns to step 1001.

Step 1003 repeats the operations at steps 1001 and 1002 for the other messages.

Next, at step 1004, the maximum load capacity of each circuit element is calculated by using the corresponding approximation formula.

Next, at step 1005, an integrated circuit device is so designed as to make the load capacity of each circuit element to be held under the corresponding calculated maximum load capacity. For example, the total length of the output line of the circuit element is caused to be less than a predetermined value.

Then, the routine of FIG. 10 is completed by step 1006.

In the second embodiment, the routine of FIG. 7 is modified into a routine of FIG. 11.

First, at step 1101, at least two circuit elements for sequentially transmitting a signal are detected, and the rising time of the output signal of the preceding circuit element is calculated to set it as the rising time of the input signal of the post stage circuit element. That is, this rising time is input as conditional data for the post stage circuit element.

Next, at step 1102, the maximum load capacity $C_{max}$ of the post stage circuit element is calculated from the approximation formula of the RAM of the host computer 1 by using the input conditional data.

Next, at step 1103, the calculated maximum load capacity $C_{max}$ is compared with the load capacity C of the circuit element being examined. As a result, if it is found that the load capacity C of the circuit element does not exceed the maximum load capacity $C_{max}$, the control directly proceeds to step 1105 to complete the operation of modifying the design for the circuit element. If, on the other hand, it is found that the load capacity C of the circuit element exceeds the maximum load capacity $C_{max}$, the control proceeds to step 1104, which modifies the design data to make the load capacity C of the circuit element go below the maximum load capacity $C_{max}$.

In the second embodiment, the operation of determining the maximum load capacity by means of the approximation formula is by far less time consuming if compared with any comparable operation utilizing simulation so that the overall time to be spent for designing an integrated circuit device will be significantly reduced.

In FIGS. 4 and 8, although a so-called client-server system is used for a circuit designing system for implementing a circuit designing method according to the present invention, the circuit design system may alternatively be realized in the form of a stand-alone computer.

Additionally, in FIG. 4, the workstation such as 2-1 utilizes the database 1a prepared by the host computer 1 on an on-line basis, the database prepared by the host computer 1 may alternatively be made available to the workstation 2-1 on an off-line basis by utilizing floppy disc or a similar storage means.

Still further, the various means of the circuit designing systems of FIGS. 4 and 8 are realized by the CPU as the latter operates according to the control program stored in the RAM as software at the host computer 1 and the workstation such as 2-1. However, each of the various means may be realized in the form of a specific piece of hardware. Or, some of the various means may be realized by the CPU as the latter operates according to the control program stored in the RAM as software while the others are realized in the form of specific pieces of hardware.

While the software stored in the HDD is copied into the RAM when the host computer 1 and the workstation as 2-1 starts operating and the CPU reads the software from the RAM, alternatively the CPU may read the software directly from the HDD or the software may invariably be stored in the ROM in advance.

Additionally, while the software may be temporarily stored in an independent data recording medium such as the FD or the CD-ROM before it is installed in the RAM, it is also possible to make the CPU directly read the software from the FD and execute processing operations according to the software without installing it in the RAM.

In short, what is necessary to realize the above described various means of the circuit designing system by using software and the circuit design method according to the present invention is simply to provide a condition under which the CPU can read the software and execute processing operations accordingly. It is also possible to produce a control program for realizing the various means by combining a plurality of pieces of software. Then, the independent data recording medium is required to store only a minimum number of pieces of software necessary for realizing the circuit designing system by using the circuit design method according to the present invention.

More specifically, it is a popular practice to use an application program (software) stored in a data recording medium such as the CD-ROM with the host computer 1 equipped with a known operating system. Then, the various means for realizing a circuit designing system for the purpose of the present invention are produced through a combined use of an application program and an operating system so that the part of the software relying on the operating system can be omitted from the application program stored in a data recording medium.

As explained hereinabove, according to the present invention, since no simulation for determining by calculation the maximum load capacity is necessary at the time of actually designing an integrated circuit device, the time required for designing the device can be significantly reduced to make the design of the device very simple and easy. Also, each of the circuit elements of the designed integrated circuit device can reliably show a load capacity smaller than the maximum load capacity.

What is claimed is:

1. A method for designing an integrated circuit device, comprising the steps of:

calculating for each of a number of circuit elements of said integrated circuit device a maximum load capacity by a simulation method providing a guaranteed period within which the element is not degraded beyond predetermined limit by hot carriers;

storing said calculated maximum load capacities in a database with conditional data on said circuit elements;

calculating a response time to an output signal of an upstream one of at least two circuit elements of a designed integrated circuit device, said at least two circuit elements sequentially transmitting a signal of said designed integrated circuit device;

setting said response time as said conditional data in a response time to an input signal of a downstream one of said at least two circuit elements;

retrieving from said database a maximum load capacity for the downstream one of said at least two circuit elements by using said conditional data;

comparing the load capacity of the downstream one of said at least two circuit elements with the retrieved maximum load capacity; and modifying said designed integrated circuit device so that the load capacity of the downstream one of said two circuit elements is made smaller than the retrieved maximum load capacity.

2. The method as set forth in claim 1, wherein said modifying step enlarges a gate width of said circuit element.

3. The method as set forth in claim 1, wherein said modifying step decreases an output line of said circuit element.

4. The method as set forth in claim 1, wherein said modifying step modifies said circuit element.

5. The method as set forth in claim 1, wherein said modifying step modifies a circuit element downstream of said circuit element.

6. The method as set forth in claim 1, wherein said input conditional data includes a data width of said circuit element, a response time of an input signal of said circuit element, a maximum operating frequency of said device, a maximum operating voltage of said device, a guaranteed operating temperature of said device, a switching possibility of said circuit element and a guaranteed time of said device.

7. A method for designing an integrated circuit device, comprising the steps of:

calculating for each of a number of circuit elements maximum load capacity by a simulation method providing a guaranteed period within which the element is not degraded beyond a predetermined limit by hot carriers, the step of calculating including the steps of formulating approximation formulae for approximately determining said maximum load capacities, and approximately calculating, with the approximation formulae, said maximum load capacity for a circuit element used in said integrated circuit device in accordance with an input conditional data;

detecting a response time to an output signal of an upstream one of at least two circuit elements of a designed integrated circuit device, said at least two circuit elements sequentially transmitting a signal of said designed integrated circuit device;

setting said detected response time as said conditional data in a response time to an input signal of a downstream one of said at least two circuit elements;

approximately calculating a maximum load capacity for the downstream one of said at least two circuit elements by using said conditional data;

comparing the load capacity of the downstream one of said at least two circuit elements with the approximately calculated maximum load capacity; and modifying said designed integrated circuit device so that the load capacity of the downstream one of said two circuit elements is made smaller than the approximately calculated maximum load capacity.

8. The method as set forth in claim 7, wherein said modifying step enlarges a gate width of said circuit element.

9. The method as set forth in claim 7, wherein said modifying step decreases an output line of said circuit element.

10. The method as set forth in claim 7, wherein said modifying step modifies said circuit element.

11. The method as set forth in claim 7, wherein said modifying step modifies a circuit element downstream of said circuit element.

12. The method as set forth in claim 7, wherein said input conditional data includes a data width of said circuit element, a response time of an input signal of said circuit element, a maximum operating frequency of said device, a maximum operating voltage of said device, a guaranteed operating temperature of said device, a switching possibility of said circuit element and a guaranteed time of said device.

* * * * *